United States Patent [19]

Rose

[11] Patent Number: 5,084,622
[45] Date of Patent: Jan. 28, 1992

[54] CORRECTION SYSTEM FOR A CHARGED-PARTICLE BEAM APPARATUS

[75] Inventor: Harald Rose, Darmstadt, Fed. Rep. of Germany

[73] Assignee: U.S. Philips Corporation, New York, N.Y.

[21] Appl. No.: 564,221

[22] Filed: Aug. 7, 1990

[30] Foreign Application Priority Data

Apr. 12, 1990 [EP] European Pat. Off. .......... 90200909

[51] Int. Cl.$^5$ .............................................. H01J 37/10
[52] U.S. Cl. ......................... 250/396 R; 250/396 ML
[58] Field of Search ........... 250/311, 396 R, 396 ML, 250/398

[56] References Cited

U.S. PATENT DOCUMENTS 4,389,571  6/1983  Crewe ........................ 250/396 R
4,414,474  11/1983 Crewe ........................ 250/396 R
4,962,313  10/1990 Rose ............................. 250/311

OTHER PUBLICATIONS

Rose, H., "Correction of Aperture Aberrations in Magnetic Systems with Threefold Symmetry", Nuclear Instruments & Methods, 187, (1981), pp. 187–199.
Rose, H., "Inhomogeneous Wien Filter as a Corrector Compensating for the Chromatic and Spherical Aberration of Low-Voltage Electron Microscopes", OPTIK: Journ. for Light & Electron Optics, vol. 84, No. 3, Mar. 1990, pp. 92–107.

Primary Examiner—Bruce C. Anderson
Attorney, Agent, or Firm—Robert J. Kraus

[57] ABSTRACT

A correction system for a high resolution charged particle beam apparatus provided with two hexapoles enclosing a telescopic round-lens system with two lenses which are arranged so that outer focal points of the lenses are coincident with nodal points which coincide with center points of the hexapoles. An additional coma-free round-lens doublet is added for imaging a coma-free plane of a lens to be corrected into a center plane of a first hexapole of the system. For both round-lens doublets the spacing between of the two lenses preferably equals 2f, f being the focal length of each lens.

12 Claims, 1 Drawing Sheet

CORRECTION SYSTEM FOR A CHARGED-PARTICLE BEAM APPARATUS

BACKGROUND OF THE INVENTION

The invention relates to a correction system for a high resolution charged-particle beam apparatus provided with a first and a second hexapole enclosing a round lens system.

Such a correction system is known from U.S. Pat. No. 4,414,474. A hexapole corrector described in U.S. Pat. No. 4,414,474 is dedicated to correct third-order spherical aberration particularly in a scanning transmission electron microscope (STEM). This corrector is free of axial aberrations only. Owing to the non-vanishing second order off-axial aberrations, these correctors result in a relatively small field of view. Due to the use of a single magnetic lens between the hexapoles, this corrector causes a fourth-order aperture aberration preventing an appreciable improvement in resolution in optical systems having a relatively wide field of view such as a transmission electron microscope.

SUMMARY OF THE INVENTION

It is an object of the invention to provide a corrector which can correct also for off-axial aberrations without introducing a fourth-order axial aberration. To this end, a corrector as introduced in the preamble according to the invention is characterized in that the round-lens system comprises exterior nodal points which are located in the centre of an adjacent hexapole for imaging the two hexapoles one into the another with unit magnification.

Due to the fact that according to the invention, the round-lens system between the two hexapoles is optically arranged as given, the correction system can, in a paraxial approximation, become telescopic and rotation free. The hexapoles, being centered about the nodal points of the round-lens system, can now be used for correcting third-order spherical aberration of a transmission electron microscope because in this arrangement they do not introduce any second-order aberration in the final image. The centre points of the hexapoles, being located outside the focussing magnetic fields of the round lenses coincide with centre points of the hexapoles. The round-lens system perferably being composed as a doublet.

In a preferred embodiment two lenses of the round-lens system or doublet are spaced a distance 2f apart and are preferably identical. In this arrangement field aberrations of the two lenses are mutually compensated for and a substantial enlargement in the field of view is thus allowable without distrubing aberrations being introduced. The two lenses are preferably composed of identical magnetic coils which are connected in series in such a manner that the absolute coil current is identical but is opposed for the two lenses. This makes the lens system rotation-free and strongly reduces the occurence of anisotropic coma in the lens system as well as any fourth-order aperture aberration.

In a preferred embodiment the two hexapoles are identical. Each hexapole can consist of two hexapole elements in order to enable shifting of the centre points of the hexapoles along the axis to ensure exact coincidence with the nodal points of the round lenses. Such a shift can be realised by controlling the energizing balance of the two hexapole elements.

In order to compensate for non rotationally symmetrical fifth-order aperture aberration, a twelve-pole field can be added to each of the hexapole fields, which twelve-pole fields are to be generated within a twelve-pole element.

In a further embodiment there is added a second round-lens doublet preferably situated a focal distance f in advance of the centre of an entrance hexapole, the two round lenses of the additional doublet being situated at a distance 2f, from one another.

In a preferred embodiment the correction is optimized in that the second round-lens doublet is arranged with respect to a lens to be corrected so that a coma-free plane of the lens to be corrected coincides with the centre plane of the entrance hexapole. This can be realized better as the coma-free plane of the lens to be corrected is located closer to or outside an exit boundary of the construction of said lens. This offers an arrangement in which the coma-free plane of a lens to be corrected is imaged by a coma-free round-lens doublet into a plane which is located well outside the field of the doublet. To ensure an aplanatic lens, the coma-free round-lens doublet can be arranged to image the coma-free plane of the lens to be corrected into the centre plane of the first hexapole of the correction system. The coma-free plane thus can easily be imaged into the centre of the first hexapole.

In a preferred embodiment the correction system constitutes, measured from a coma-free plane of a lens to be corrected, an 8f system with two hexapoles and two round-lens doublets, in which system a first focal point of the second doublet coincides with a coma-free point of the lens to be corrected, the outer focal points of the first doublet coinciding with its nodal points. The hexapoles are centered about these nodal points. All said optical elements can be accommodated in a single housing to be introduced into an apparatus to be corrected.

In order to compensate for aberrations in the lens to be corrected it is advisable to connect the two lenses of the second doublet in series in such a manner that they are energized in the opposite sense with respect to the lens, to be corrected.

The correction system is especially attractive for correcting lenses of a probe forming type.

An apparatus to be corrected with the aid of a correction system according to the invention is preferably provided with a particle source with a relatively small energy spread in the particles emitted such as an electric field source, an adapted semiconductor electron emitter for an electron beam apparatus, etc.

BRIEF DESCRIPTION OF THE DRAWING

Some embodiments of the invention will be described in detail hereinafter with reference to the accompanying drawing; therein.

DESCRIPTION OF THE PREFERRED EMBODIMENT

Figure 1:
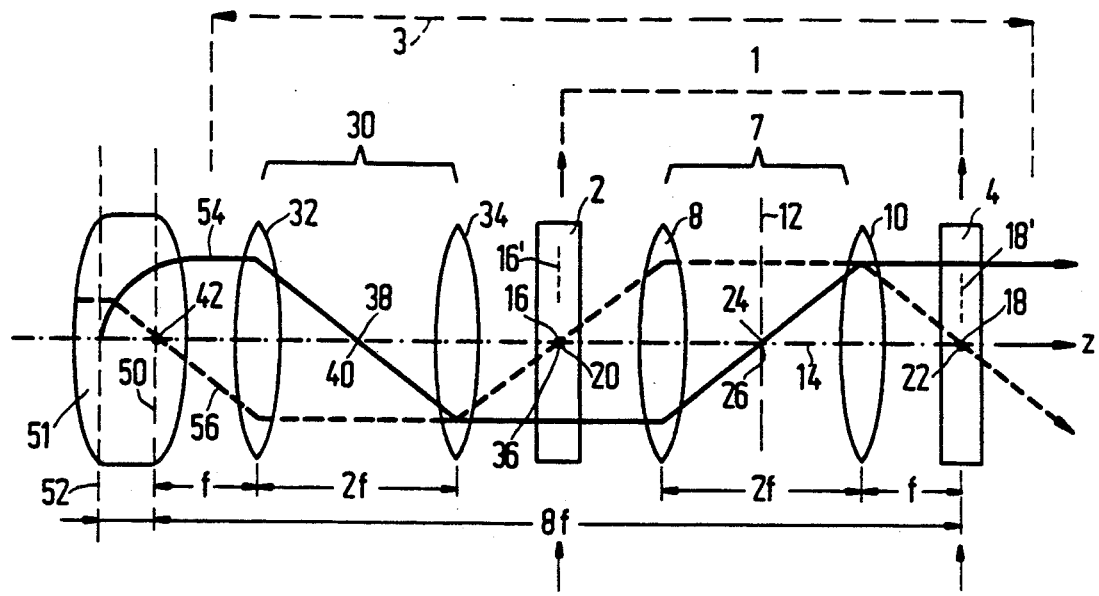
FIG. 1 shows schematically a correction system according to the invention.

A correction system as shown in FIG. 1 comprises a hexapole system with a first hexapole 2 and a second hexapole 4. A first part 1 of the correction system comprises a round-lens doublet 7, having a first round lens 8 and a second round lens 10, and is symmetrical with respect to a centreplane 12, extending perpendicularly to an optical axis 14 in the middle between the two round lenses. The two hexapoles are thus interchangeable. The preferably identical hexapoles are centered about the nodal points 16 and 18, which, due to the symmetrical construction of the round-lens doublet 7, are located in the middle of the hexapoles. Whenever applicable, planes perpendicular to the optical axis 14 through the nodal points of the round-lens doublet 7 will be referred to as nodal planes 16' and 18'. In the embodiment shown a first focal point 20 of the first round lens 8 coincides with the nodal point 16 and a second focal point 22 of the second round lens 10 coincides with the nodal point 18 of the first round-lens doublet. The two round lenses 8 and 10 are spaced a distance 2f apart, so that a second focal point 24 of the first round lens 8 coincides with a first focal point 26 the second round of lens 10, both focal points being situated in the centre plane 12. Each hexapole can be composed as a doublet such that by energizing the two components of each hexapole to a slightly different extent the centre points can be shifted axially. These points can thus be made to coincide exactly with the focal points of the two round lenses. As has already been stated, each hexapole field also can be excited within a twelve-pole system to enable generation of, for example a twelve-pole field for compensating for nonrotationally symmetrical fifth-order aperture aberration caused by the pure hexapole fields. Care should be taken that no dipole and quadrupole fields influencing the paraxial rays are generated in the multi-pole elements.

The two round lenses are preferably composed as electromagnetic coils which are connected in series in such a manner that they carry equal but opposite currents. Moreover, the hexapoles are preferably identical, and so are both round lenses.

To the system described thus far there is added a second round-lens doublet 30 thus forming a combined corrector 3. This doublet is preferably identical to the first doublet 7 and comprises two lenses 32 and 34.

A second focal point 36 of the second lens 34 is coincident with the nodal point 16 of the first round-lens doublet 7. The two lenses 32 and 34 are also spaced a distance 2f apart so that a first focal point 38 of the lens 34 coincides with a second focal point 40 of the lens 32. A first focal point 42 of the lens 32 coincides with a coma-free plane 50 of a lens system 51 to be corrected. This lens system 51, for example an objective lens of an electron microscope, has an object plane 52 as from which an axial ray 54 and a field ray 56 are indicated to extend through the whole system.

The field ray passes through the centre points of both hexapoles and is not affected by the latter. The second round-lens doublet 30 images the coma-free plane into the centre plane 16' of the first hexapole 2 without introducing any additional off-axial aberration.

Figure 2:
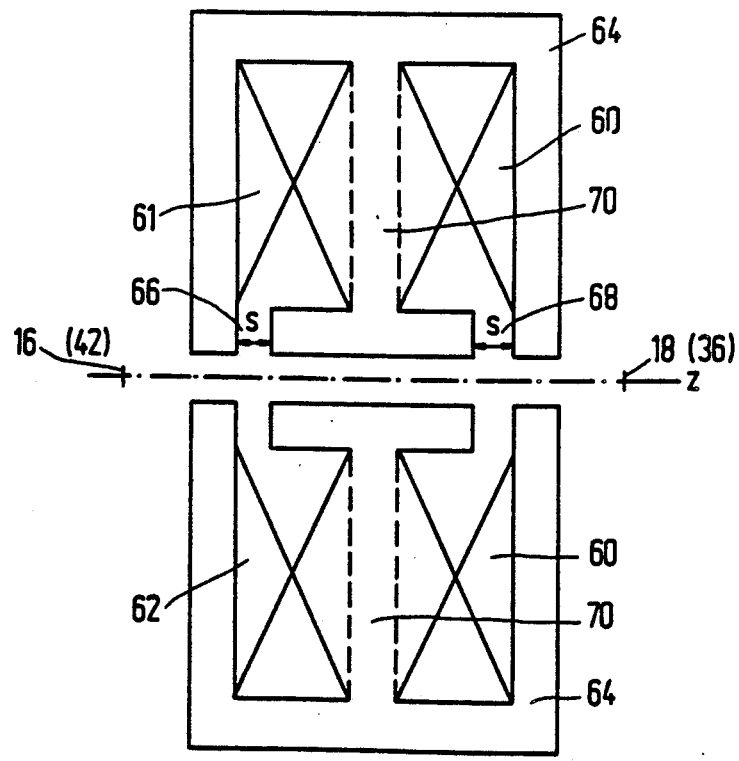
FIG. 2 shows a round-lens doublet for such a correction system accommodated in a single housing.

FIG. 2 shows an example of a round-lens system in the form of a doublet such as the doublets 7 or 30 in FIG. 1. The system comprises two coils 60 and 62 and an iron yoke 64 provided with two gaps 66 and 68 via which the two desired lens fields are produced. An intermediate part 70 of the coil former is indicated as an alternative, because this part is present only in a doublet in which the two coils are both energized in the same sense. Nodal points 72 and 74 of the lens system coincide either with the centre points 20 and 22 of the surrounding hexapoles when they form part of the doublet 7, or with the coma-free point 50 and the centre 20 of the hexapole 2 when they form part of the doublet 30.

A correction system according to the invention can be used in electron microscopes and the like. When provided with a second round-lens doublet, for transferring the coma-free plane of a lens system to be corrected, this doublet should be situated subsequent to said lens system, viewed in the propagation direction of the charged particle beam. The correction system is particularly useful for the correction of an objective lens in an electron microscope as disclosed in U.S. Pat. No. 4,306,149.

I claim:

1. A correction system for a high resolution charged particle beam apparatus, said system comprising, disposed along an axis:
   a. first and second spaced apart hexapoles, each having a respective center plane;
   b. a first round lens system situated between the first and second hexapoles and including first and second lenses, each of said lenses being located at a focal distance f from the center plane of a respective one of the hexapoles, said first round lens system imaging the center plane of the first hexapole into the center plane of the second hexapole; and
   c. a second round lens system situated in front of the first hexapole and including third and fourth lenses spaced apart by a distance 2f, one of said third and fourth lenses being situated at a distance f from the center plane of said first hexapole.

2. A correction system as claimed in claim 1, characterized in that the system comprises an 8f lens system as measured from an entrance plane to the center plane of the second hexapole.

3. A correction system as claimed in claim 1 or 2, characterized in that the two hexapoles are identical.

4. A correction system as claimed in claim 1 or 2, characterized in that each of the two hexapoles is composed as a doublet in order to enable an axial shift of its centre points.

5. A correction system as claimed in claim 1 or 2, characterized in that the hexapole fields are generated within a twelve-pole system in that to each of the two hexapoles there is added a twelve-pole field for generating a correction for the non-rotationally symmetrical fifth-order aberration of the hexapole fields.

6. A correction system as claimed in claim 1 or 2, characterized in that the center planes of the hexapoles are located outside of focussing magnetic fields of the energized round lens systems.

7. A charged particle beam apparatus including a correction system comprising, disposed along an axis:
   a. first and second spaced apart hexapoles, each having a respective center plane;
   b. a first round lens system situated between the first and second hexapoles and including first and second lenses, each of said lenses being located at a focal distance f from the center plane of a respective one of the hexapoles, said first round lens system imaging the center plane of the first hexapole into the center plane of the second hexapole;
   c. a second round lens system situated in front of the first hexapole and including third and fourth lenses spaced apart by a distance 2f, one of said third and fourth lenses being situated at a distance f from the center plane of said first hexapole; and d. a coma free lens system disposed for imaging a coma free plane thereof into the center plane of the first hexapole.

8. A charged particle beam apparatus as claimed in claim 7, characterized in that the coma free lens system includes a coma free point located close to an exit boundary of said lens system.

9. A charged particle beam apparatus as claimed in claim 7 or 8, characterized in that the coma free lens system comprises a probe forming lens.

10. A charged particle beam apparatus as claimed in claim 7 or 8, characterized in that the second round lens system includes:

a. a first focal point which coincides with a coma free point of the coma free lens system; and b. a second focal point which coincides with a center point of the first hexapole.

11. A charged particle beam apparatus as claimed in claim 7 or 8, characterized in that the second round lens system includes electromagnetic coils which are connected in series so as to be energized by a current flowing in a direction opposite to that of an energizing current for the coma free lens system.

12. A charged particle beam apparatus as claimed in claim 7 or 8 comprising an electron source having a relatively small energy spread.

* * * * *